(12) United States Patent
Wong et al.

(10) Patent No.: US 6,605,857 B2
(45) Date of Patent: Aug. 12, 2003

(54) REDUCING MAGNETIC COUPLING USING TRIPLE WELL

(75) Inventors: Ting-Wah Wong, Cupertino, CA (US); Chong L. Woo, Fremont, CA (US); Clement Szeto, Union City, CA (US)

(73) Assignee: Programmable Silicon Solutions, San Jose, CA (US)

( * ) Notice: Subject to any disclaimer, the term of this patent is extended or adjusted under 35 U.S.C. 154(b) by 0 days.

(21) Appl. No.: 09/990,980

(22) Filed: Nov. 20, 2001

(65) Prior Publication Data

US 2002/0047182 A1 Apr. 25, 2002

Related U.S. Application Data (63) Continuation-in-part of application No. 09/618,067, filed on Jul. 17, 2000, now Pat. No. 6,455,915, which is a continuation-in-part of application No. 09/596,486, filed on Jun. 19, 2000, which is a continuation-in-part of application No. 09/580,713, filed on May 30, 2000, now abandoned.

(51) Int. Cl.$^7$ ............................................. H01L 29/00
(52) U.S. Cl. ...................................... 257/531; 257/548
(58) Field of Search ................................. 257/531, 544, 257/548–550, 577; 438/210, 238, 228, 233, 381

(56) References Cited

U.S. PATENT DOCUMENTS 5,796,125 A * 8/1998 Matsudai et al. ........... 257/141
6,133,079 A * 10/2000 Zhu et al. ................... 438/210

* cited by examiner

Primary Examiner—Ori Nadav
(74) Attorney, Agent, or Firm—Trop, Pruner & Hu, P.C.

(57) ABSTRACT

An integrated inductive element may be formed over a substrate. A triple well may be defined in a star-shape, in one embodiment, in the substrate beneath the integrated inductive element in order to reduce eddy current losses arising from magnetic coupling between integrated inductors associated with the same integrated circuit.

10 Claims, 11 Drawing Sheets

REDUCING MAGNETIC COUPLING USING TRIPLE WELL

This is a continuation-in-part of U.S. patent application Ser. No. 09/618,067 filed Jul. 17, 2000, now U.S. Pat. No. 6,455,915 which is a continuation-in-part of U.S. patent application Ser. No. 09/596,486 filed Jun. 19, 2000 which is a continuation-in-part of U.S. patent application Ser. No. 09/580,713, filed May 30, 2000 abandoned.

BACKGROUND

This invention relates generally to radio frequency (RF) integrated circuits that include active devices and passive components such as inductors and capacitors used for radio frequency devices such as cellular telephones and wireless network devices such as Bluetooth and other wireless devices and personal digital assistants.

The technology for manufacturing integrated circuits has conventionally divided integrated circuits into various categories based on the compatibility of processes and other considerations. Generally, radio frequency circuits have not been mixed with logic circuits in the same integrated circuit. Radio frequency circuits are analog circuits that are involved in filtering and detecting radio frequency signals such as cellular telephone signals. In contrast, logic circuits generally include transistors and other active components that form digital integrated circuit devices. Thus, for example, bipolar techniques may be utilized to manufacture radio frequency circuits and standard complementary metal oxide semiconductor (CMOS) processes may be utilized to manufacture logic circuits.

Memory circuits may account for still another category. Generally, special processes may be utilized in connection with the manufacture of memory circuits because of special design considerations such as multiple gate electrodes and special voltage supply needs. Thus, memory circuits are often fabricated separately from logic circuits.

Still another category are the so-called mixed signal circuits which may include both digital and analog components. These signals too may be accounted for separately so that a device that includes RF signal processing, RF integrated circuits, mixed signal circuits, logic circuits and memory circuits may be made up of a number of separately fabricated integrated circuit chips.

The cost of an electronic device may be closely correlated to the extent of integration that is possible. The more devices and the more types of devices that can be integrated into a single integrated circuit and manufactured using highly replicated techniques, the lower the resulting price. Unfortunately, because of incompatibilities between the different types of integrated circuits, it has not been possible, to date, to fabricate both radio frequency circuits, mixed signal circuits, logic circuits and memory circuits all on the same standard CMOS integrated circuit process.

One problem that arises in connection with radio frequency circuits in CMOS processes is that the passive components such as capacitors and inductors may be adversely affected by the substrates over which they are formed. In particular, coupling may occur between the substrate and integrated circuit inductors for example. This coupling may result in degraded performance of inductive circuits. As a result, inductive circuits may be formed in bipolar or silicon over insulator (SOI) integrated circuits rather than using standard CMOS logic processes. Thus, two or more integrated circuits are needed--one for logic, one for RF circuits, one for memory and one for mixed signals.

Some efforts have been made to overcome this coupling problem. For example, Silicon Wave Inc. has devised a so-called silicon over insulator (SOI) BiCMOS (Bipolar CMOS) integrated circuit which integrates both logic and radio frequency components onto the same die. However, the use of silicon over insulator technology greatly complicates the manufacturing process and increases cost. Moreover, the bulk of semiconductor fabrication facilities in the United States and the rest of the world are dedicated to manufacturing metal oxide semiconductor technologies. The SOI process is not amenable to widespread manufacturing at a number of highly expensive, already existent, fabrication facilities.

In addition to capacitive coupling of substrate noise, magnetic coupling between integrated inductors on the same integrated circuit may also be problematic. The coupling between integrated inductors on the same circuit may adversely effect the operation of any given inductor. For example, the magnetic coupling may change the operating parameters of one or more integrated inductors on the same integrated circuit.

The quality factor or Q factor strongly depends on the layout and the properties of the particular process technology. It is known that the quality of an integrated inductor may be adversely affected by the metal wire resistance, capacitive coupling to the substrate and magnetic coupling to the substrate. Capacitive and magnetic coupling limit the Q factor at relatively high frequencies. The magnetic coupling becomes more significant in CMOS technologies with doped substrates because the effect of substrate resistance appears in parallel with the inductor.

Thus, there is a substantial need to find a way to reduce coupling in integrated inductors.

DETAILED DESCRIPTION

Figure 1:
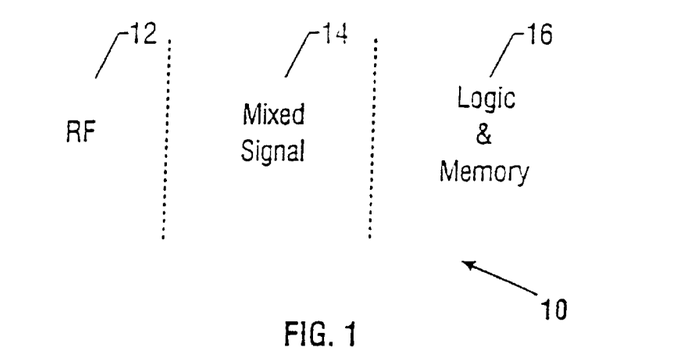
FIG. 1 is a depiction of the various families of integrated circuit technologies that may be fabricated on the same integrated circuit in accordance with embodiments of the present invention.

Referring to FIG. 1, an integrated circuit 10 may include analog circuit elements operating above 100 megahertz, such as RF components 12, mixed signal components 14 and logic and memory components 16, all integrated within the same monolithic integrated circuit. Coupling between the radio frequency circuit elements, such as inductors, capacitors and transistors and the substrate on which the components are all integrated can be reduced, if not effectively eliminated, by creating an effective reverse biased diode between the radio frequency component and the substrate. This reverse biased diode may be formed using a triple well fabrication process in which the inductive circuit element is formed over a triple well.

In addition, memory components such as flash memory and static random access memory (SRAM) may be made on the same process, in the same substrate, utilized to form logic circuits such as microprocessors and digital signal processors. For example, the processes disclosed in U.S. Pat. Nos. 5,926,418 and 5,867,425, assigned to the assignee of the present application, may be utilized to form both logic devices and flash memory.

Figure 2:
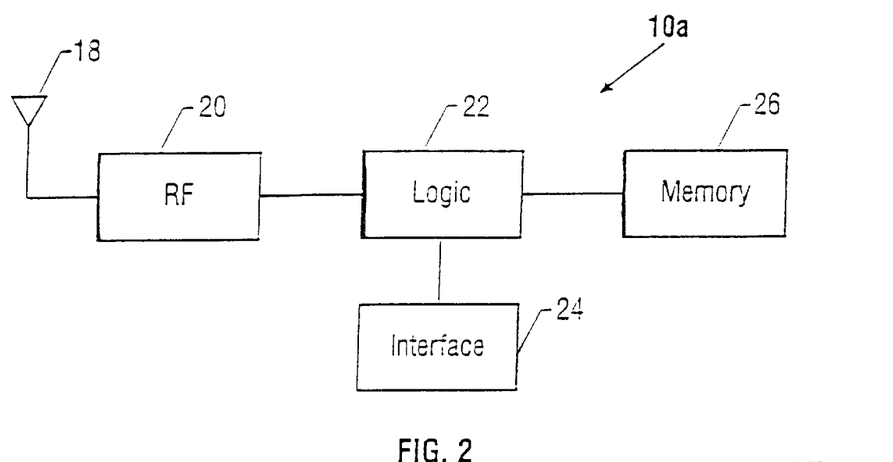
FIG. 2 is a block depiction of a cellular telephone in accordance with one embodiment of the present invention.

A radio frequency transceiver useful in a cellular telephone 10a, shown in FIG. 2, includes an antenna 18, a radio frequency section 20, a logic section 22, a memory 26 and an interface 24. The interface 24 provides the graphical user interfaces that may be displayed on display screens to implement the functions of the cellular telephone 10a. The logic circuit 22 may also include a microprocessor which operates using a memory 26. In one embodiment of the present invention, the memory 26 is a flash memory. The radio frequency section 20 may include a number of passive components including inductive circuits.

The radio frequency section 20 as well as the antenna 18 may be formed using integrated circuit techniques to create a single integrated circuit that includes all of the components 18, 20, 22, 24 and 26, in accordance with one embodiment of the present invention. In other embodiments, some but not all of the analog and digital components may be fabricated on the same integrated circuit chip.

Generally, complementary metal oxide semiconductor techniques may be utilized to form all of the components depicted in FIG. 2 on a single chip. However, in some cases, particular components may be split among two or more integrated circuits. However, the designer is free to position particular components on particular integrated circuits based on design considerations rather than process and technology incompatibilities. Again, the problem of coupling of unwanted signals to the RF components included in the radio frequency section 20 may be avoided by forming an effective reverse biased diode in the common substrate utilized to form all the components of the telephone 10a.

Figure 3:
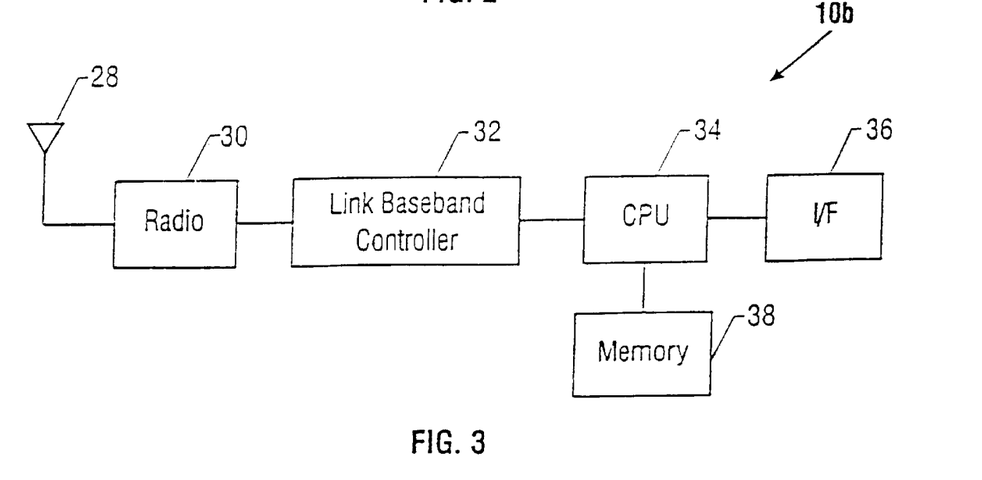
FIG. 3 is a block diagram of a Bluetooth transceiver in accordance with one embodiment of the present invention.

Similarly, an integrated transceiver 10b for a wireless network, for example in accordance with the Bluetooth specification may be fabricated using the same principles. The Bluetooth transceiver 10b includes an antenna 28 coupled to a radio 30. The radio 30 is coupled to a link baseband controller or link controller 32. A central processor unit 34 couples an interface 36 and a memory 38. In some embodiments of the present invention, the memory 38 may be a flash memory. All of the components may be integrated into a single chip in one embodiment.

Figure 4:
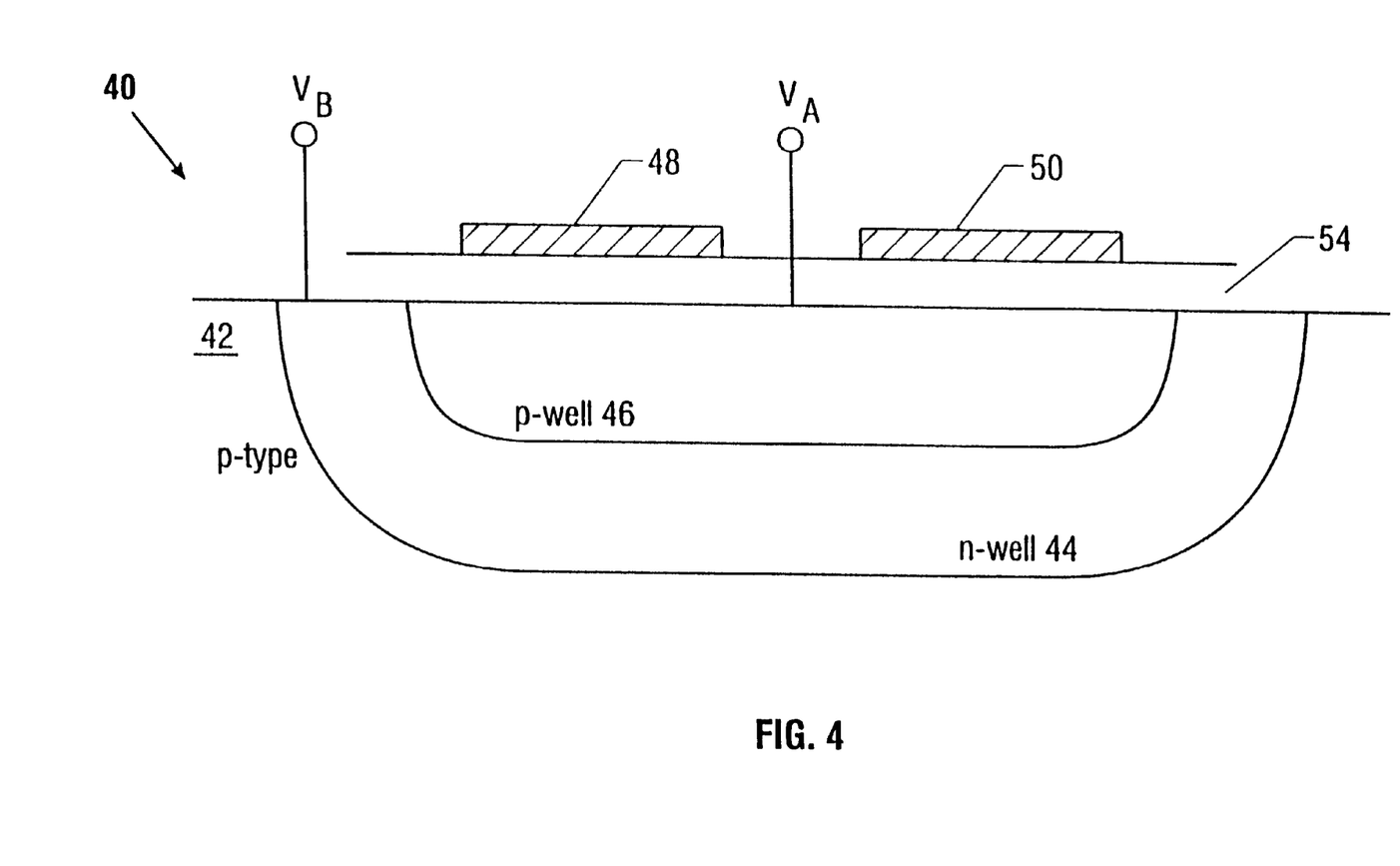
FIG. 4 is a greatly enlarged cross-sectional view of an inductive circuit element in accordance with one embodiment of the present invention.

An integrated radio frequency (RF) element 40 that may be utilized in connection with the RF section 20 or the radio 30 of the embodiments of FIGS. 2 and 3 or any other integrated circuit using an inductive element, is shown in FIG. 4. In this case, a triple well is defined within the substrate 42 by a P-well 46, a deep N-well 44 and the P-type substrate 42. The P-well 46 is a well or tub within the deep N-well 44.

Two reverse biased pn junctions are created, one by the juxtaposition of the P-well 46 and N-well 44, and another by the juxtaposition of the P-type substrate 42 and the N-well 44. Both pn junctions may be biased by a potential $V_B$ on the N-well 44. For example, if the P-well 46 and P-type substrate 42 are grounded, increasing the bias potential on the N-well 44 increases the bias on each junction. In some embodiments, if the N-well 44 is biased, the P-well 46 floats.

Depletion regions are formed by the junction bias, adding a depletion capacitance across the pn junctions between the P-well 46 and N-well 44 and between the N-well 44 and the P-type substrate 42. These depletion capacitances can be reduced by increasing the bias across the pn junctions. The higher the junction bias, the more reduction in the junction capacitance, reducing the total capacitance. Reducing total capacitance reduces the capacitive coupling of the RF circuits to the substrate and the self-resonance frequency of the inductive element 40. The reverse biased junctions reduce the coupling of noise or other unwanted signals between the substrate 42 and the RF integrated circuit components, formed over the substrate 42, such as the capacitor 48 or the inductive element 50.

The layer 54 is conventionally formed of an oxide. Of course, the present invention is equally applicable to multilayer metal processes in which the passive components, such as the inductive element 50, are formed in any desired metal layer.

The techniques for forming triple wells are well known. For example, U.S. Pat. Nos. 5,926,418 and 5,867,425 (assigned to the assignee of the present application) provide an explanation of exemplary processes for forming a triple well. The triple well process is equally applicable to manufacturing flash memory devices. By using the triple well process, a flash memory may be formed in the same integrated circuit with logic family components such as processors and digital signal processors.

Figure 5:
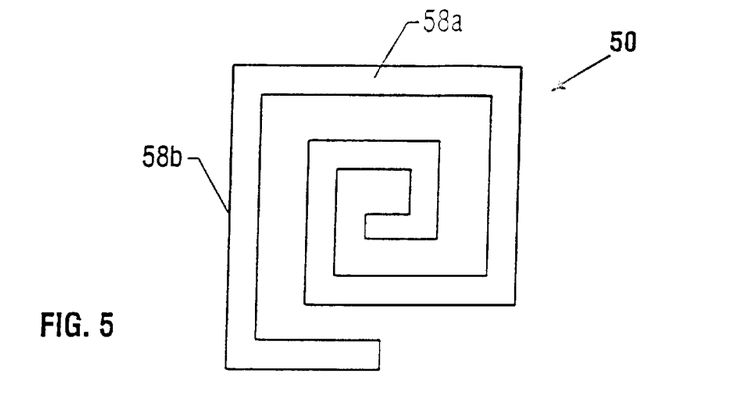
FIG. 5 is a greatly enlarged top plan view of an inductive element in accordance with one embodiment of the present invention.

Referring next to FIG. 5, the inductive element 50 may be formed of a planar, spiral-shaped layer defined over the substrate 42, for example atop a oxide layer 54. Conventionally, the inductive element 50 is formed by patterning and deposition techniques. However, any technique for forming the inductive element 50 may be utilized.

The resulting structure may be formed of a spiral-shaped flat ribbon that may include a plurality of interconnected straight sections such as the sections 58a and 58b. Advantageously, the element 50 is positioned over the P-well 46 of the triple well 40. Appropriate electrical connections may be made through various layers to electrically couple the ends of the inductive element 50 to the rest of the integrated circuit.

Figure 7:
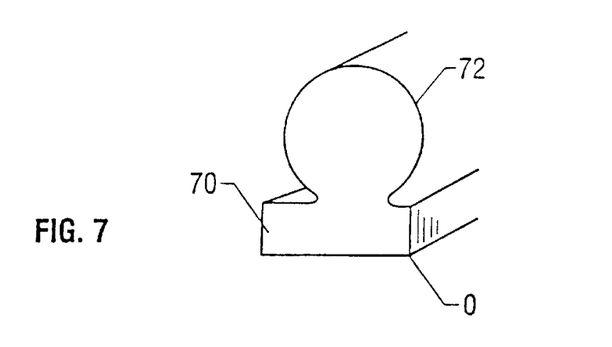
FIG. 7 is a perspective view of an embodiment of the inductive element shown in FIG. 5.

Alternatively a non-planar design may be used as shown in FIG. 7 and as described, for example in U.S. Pat. No. 5,545,916 to Koullias. The spiral inductive element 50, shown in FIG. 5, may have a non-planar cross-section as indicated in FIG. 7 including a rectangular portion 70 and a circular portion 72. Each of the trace elements 58 are arranged such that the material thickness favors the innermost edge "O". Thus, the trace shown in FIG. 7 is from the left side of the spiral inductive element 50 (shown in FIG. 5). The material is added close to an edge "O" where the current may flow at higher frequencies.

Figure 8A:
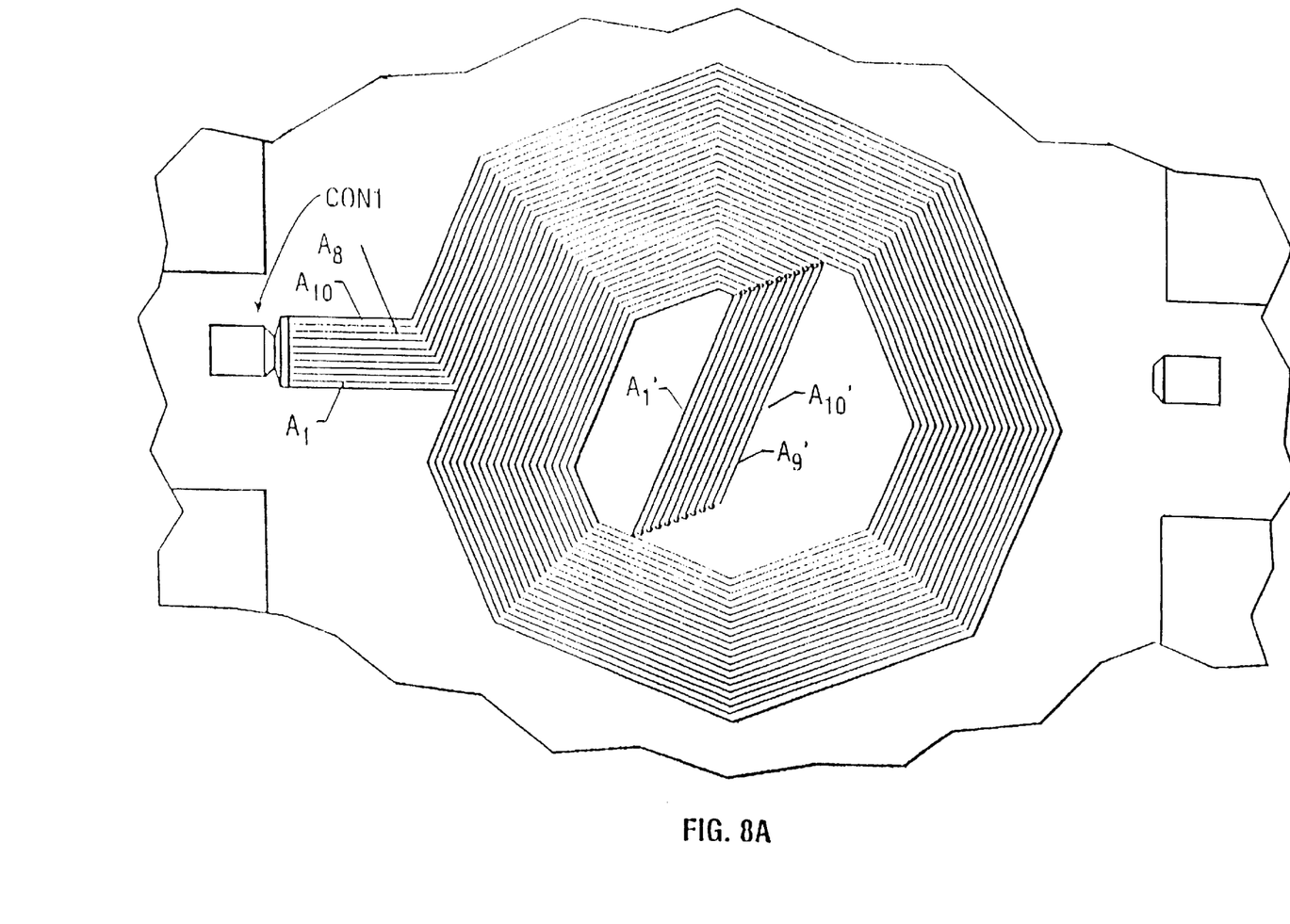
FIGS. 8A and 8B are top plan views of two different layers of an inductive element that may be used in the present invention.
Figure 8B:
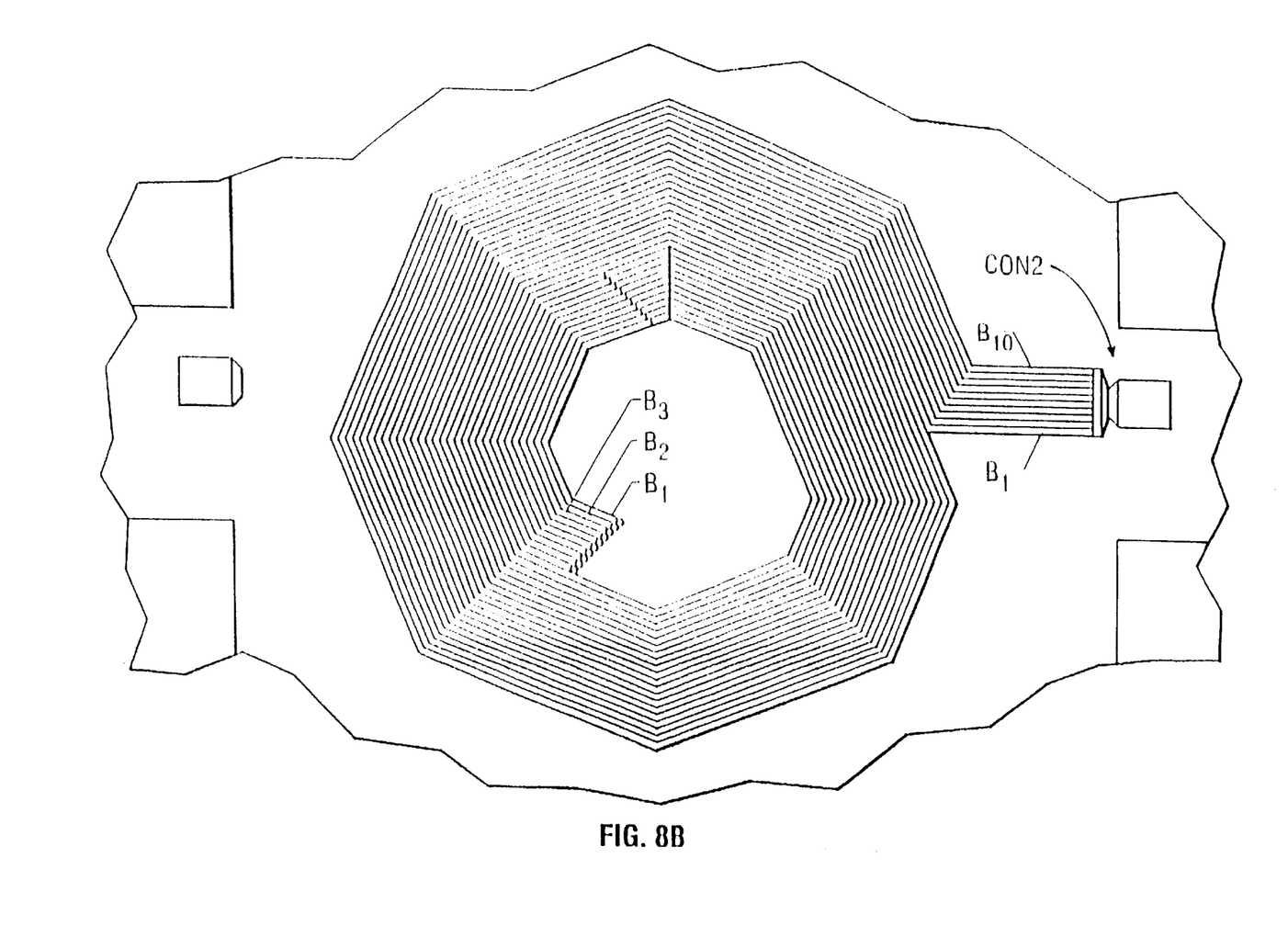

As another alternative, the spiral inductive element 50 may have an non-rectangular configuration such as the multilevel, multi-element polygonal design, for example, as set forth in U.S. Pat. No. 5,559,360, and as shown in FIG. 8. Referring to FIG. 8A, the layer with wires $A_1$ through $A_{10}$ has a first end A that is designated by the connective structure CON1. A group of ten connective wires, $A_{1'}$, $A_{2'}$, $A_{10'}$ are shown in the center of the spiral. The wires $B_1$–$B_{10}$ of the second layer, shown in FIG. 8B, are centrally connected to the wires $A_1$ through $A_{10}$ inverse sequentially. The output of the spiral inductive element is identified as a parallel connection CON2 in FIG. 8B that forms the parallel connections of all the elements of the B level. Through the use of multiple parallel conductive elements arranged on the substrate (in lieu of a single element conductive path), the resistance may be decreased and self-inductance increases. The decreased resistance and increased inductance may result in an improved quality factor (Q).

Figure 9:
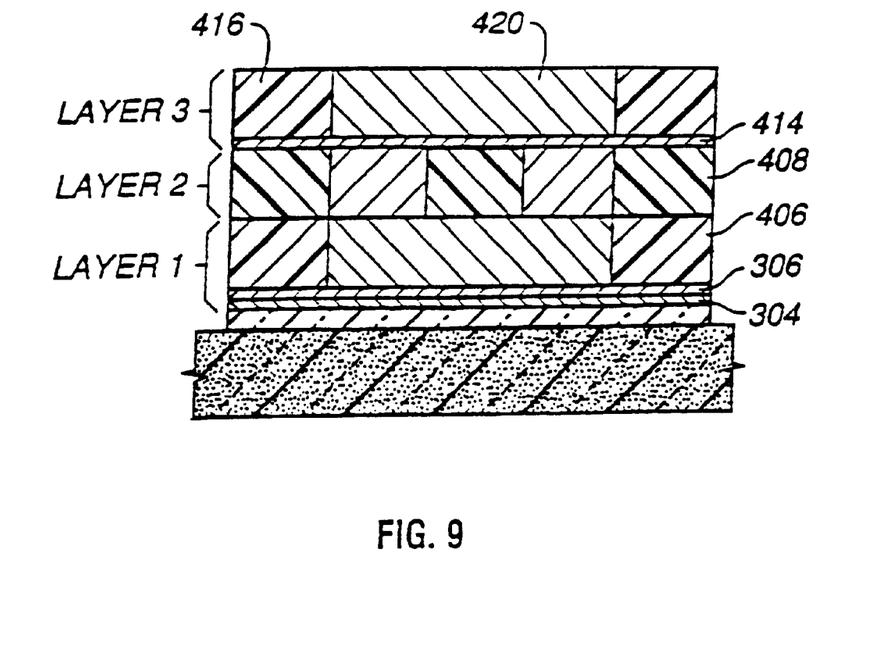
FIG. 9 is an enlarged cross-sectional view of still another embodiment of an inductive element that may be utilized in connection with the present invention.
Figure 10:
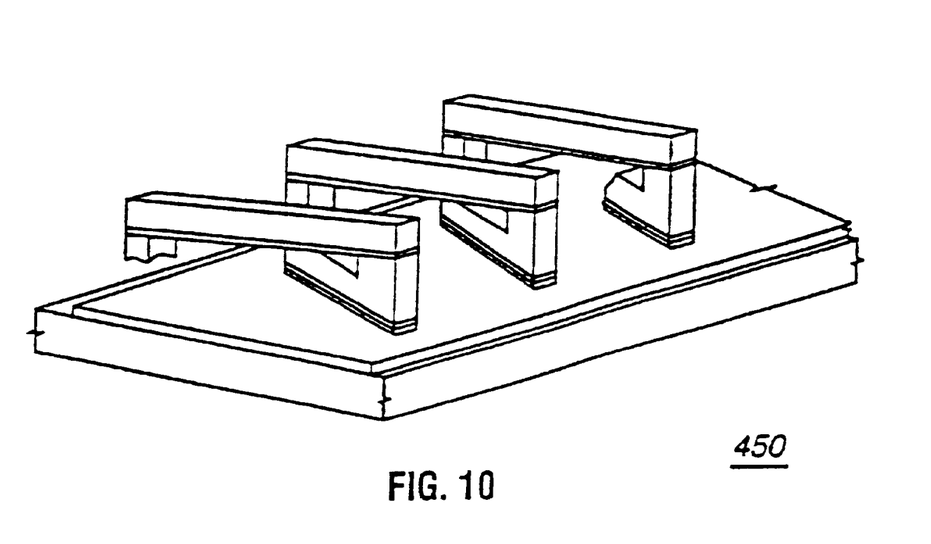
FIG. 10 is a perspective view of the inductive element shown in FIG. 9.
Figure 11:
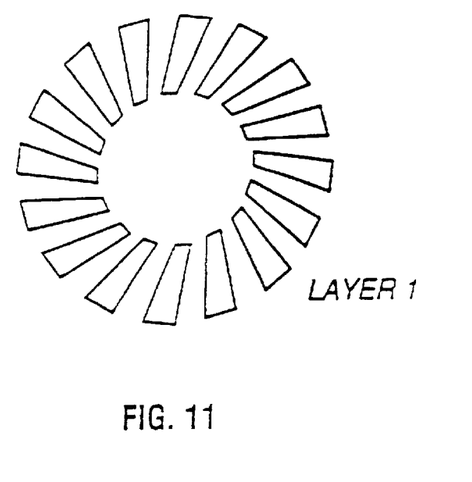
FIG. 11 is a top plan view of layer one in the embodiment shown in FIG. 9.
Figure 12:
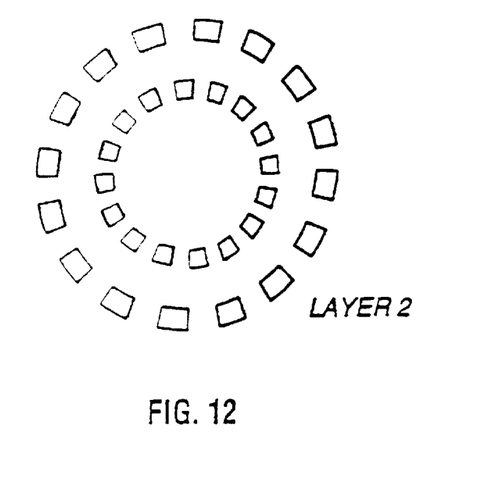
FIG. 12 is top plan view of layer two in the embodiment shown in FIG. 9.
Figure 13:
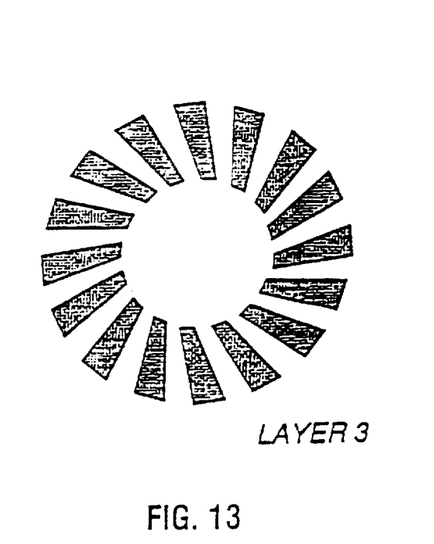
FIG. 13 is a top plan view of layer three in the embodiment shown in FIG. 9.
Figure 14:
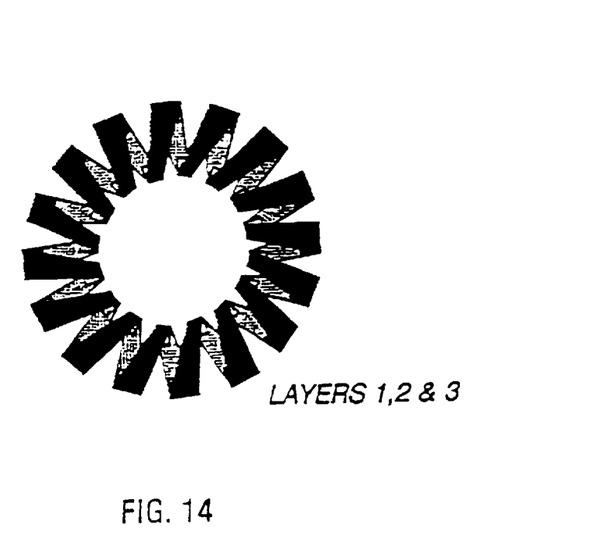
FIG. 14 is a front elevational view of the combined effect of the layers one through three in forming an inductive element.

A multi-layer non-planar integrated inductor design, as shown in FIGS. 9 through 14, may also be used as the inductive element 50 (FIG. 5), as described in U.S. Pat. No. 6,008,102. A series of three conductive layers one, two and three, are progressively coated one on top of another as shown in FIG. 9. The three layers combine to form an integrated helical coil as shown in FIG. 14. The first layer is formed of a conductive material in the shape shown in FIG. 11, the second layer is formed of a conductive material in the shape shown in FIG. 12 and the third layer is formed of conductive in the shape shown in FIG. 13. The net effect of the three layers is the coil shown in FIG. 14. The angular coil 450, shown in FIG. 10, has a series of multiple loops that are set perpendicularly to the plane of the substrate.

Referring again to FIG. 9, a layer 304 is coated over a passivated wafer. The layer 304 may be formed of a conductive material such as titanium-tungsten (TiW) to form a barrier layer and provide for the adhesion of a subsequently sputtered layer of copper 306. An initial photoresist layer 406 and a second photoresist 408 define the intervening conductive material. The layer 414 may be a sputtered conductor, and a layer 420 is a third layer of plated metal while the material 416 may be photoresist.

Figure 6:
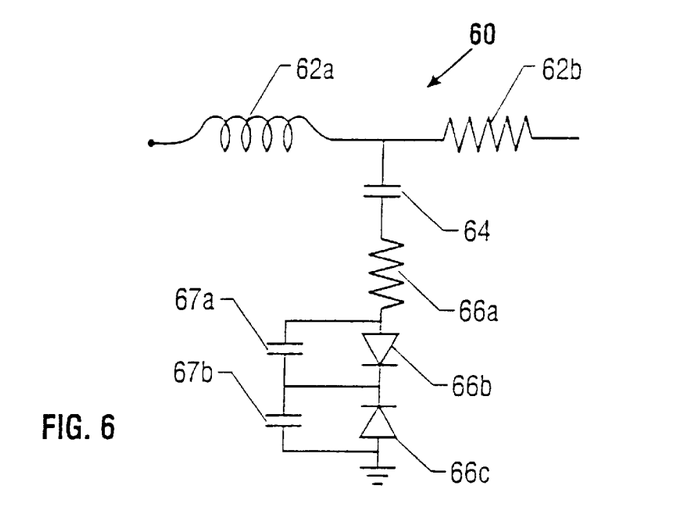
FIG. 6 is an equivalent circuit of the inductive element shown in FIGS. 4 and 5.

An equivalent circuit, shown in FIG. 6, for the inductive element 50 (FIG. 5) includes an inductance 62a which may arise from all or any part of the spiral-shaped inductive element 50. The inductive element 50 may also be represented by resistance 62b which arises from the natural resistance of the material utilized to form the spiral-shaped inductive element 50. A capacitance 64 arises from the capacitance between the inductive element 50 (or any other RF component such as transistors and capacitors) and the substrate 42 and particularly by the intervening dielectric layer 54. An additional resistance 66a may arise from the material utilized to form the P-well 46.

The effect of the pn junction created by the P-well 46 and the N-well 44 is represented by the diode 66b and the effect of the pn junction created by the N-well 44 and P-type substrate 42 is represented by the diode 66c. The capacitance 67b and the diode 66c reduce the coupling from the substrate 42 back to the inductor 50.

The reverse biased diode 66b, oriented oppositely to the diode 66c, reduces the inductive element 50 capacitive coupling losses to the substrate 42. Through the creation of the diode 66c, an effectively infinite resistance is created to reduce interference by substrate signals with the element 50 (and any other RF circuits). In particular, the inductive element 50 may be a highly tuned element that may be adversely affected by noise and other unwanted signals present in the substrate 42. These signals may be present in the substrate 42 due to the formation of a wide variety of other circuit elements in the same integrated circuit. These unwanted signals are isolated from the sensitive inductive element 50 by the reverse biased diode 66c.

As a result, a variety of different circuit types, including radio frequency circuit elements, mixed signal circuit elements, logic elements and memory elements, including flash memory elements, may all be formed in the same integrated circuit in the same substrate 42. Therefore, greater integration is possible and more efficient and lower cost radio frequency devices, such as Bluetooth transceivers and cellular telephones wireless local area networks, may be fabricated.

The benefits of the triple well can be further appreciated by comparing a triple well approach to a approach in which a single well such as a deep N-well is utilized below the inductive element 50. The impedance caused by the deep N-well, in a deep N-well embodiment, may be represented by the value $R_w$. The total impedance, Z, from the inductive element 50 to the substrate then may be represented by the equation:

$$Z = R_w + \frac{1}{j\omega C_w}$$

where $C_w$ is the capacitance resulting from the oxide between the inductive element 50 and the substrate in series with the capacitance between the N-well and the substrate and $\omega$ is the frequency. The total capacitance, $C_w$, for the series, is expressed as follows:

$$\frac{1}{C_w} = \frac{1}{C_{OX}} + \frac{1}{C_{SUB}}$$

where $C_{OX}$ is the capacitance due to the dielectric between the inductive element 50 and the substrate and $C_{SUB}$ is the capacitance between the N-well and the substrate.

In contrast the total impedance, $Z_T$, of the triple well is expressed as indicated as 64 follows:

$$Z_T = R_j + \frac{1}{j\omega C_T}$$

where $R_j$ is the resistance 66a of the N-well, P-type substrate and embedded P-well and $C_T$ is the capacitance of the triple well.

Similarly, the series capacitance created by the triple well, $C_T$, is as follows:

$$\frac{1}{C_T} = \frac{1}{C_{ox}} + \frac{1}{C_j} + \frac{1}{C_{SUB}}$$

where $C_{OX}$ is the capacitance 64 due to the oxide between the inductive element 50 and the substrate, $C_j$ is the capacitance 67a arising from the junction between the P-well and the N-well and $C_{SUB}$ is the capacitance 67b between the N-well and the substrate.

Since the impedance arising from the junction $Z_j$ is much greater than the impedance without the junction, the effect of the triple well is to substantially increase the impedance compared to a single deep N-well. Moreover, the capacitance created by the triple well can be adjusted by the N-well bias to be less than the capacitance created by the deep N-well. Thus, the coupling that results from the capacitance in the triple well is significantly less. Since the total impedance of the triple well is much greater than the impedance of the deep N-well and the capacitance of the triple well is less, there is less capacitive and resistive coupling to the substrate and also better noise isolation from the substrate to the RF circuits arising from the use of the triple well compared to the use of only a deep N-well.

The self-resonance frequency may also be improved in some embodiments, by reducing the total capacitance. The self-resonance frequency is proportional to $1/(LC)^{1/2}$, so that the lower the capacitance, the higher the self-resonance frequency or the better the high frequency performance of the inductor 50. Reducing the capacitive coupling also improves the quality factor or Q of the inductor 50.

While an illustrated embodiment using a triple well is described, additional wells may be incorporated to form a series of one or more additional diodes in other embodiments.

Even in integrated inductors with dramatically decreased capacitive coupling, magnetic coupling may still be a problem. Magnetic coupling may be a problem in at least two regards. Firstly, magnetic coupling may adversely affect the operation of an integrated inductor when other inductors are integrated within the same substrate. In addition, the magnetic coupling may adversely affect the power consumption of integrated circuits that include at least one integrated inductor. Magnetic coupling may cause eddy currents in the substrate.

Figure 15:
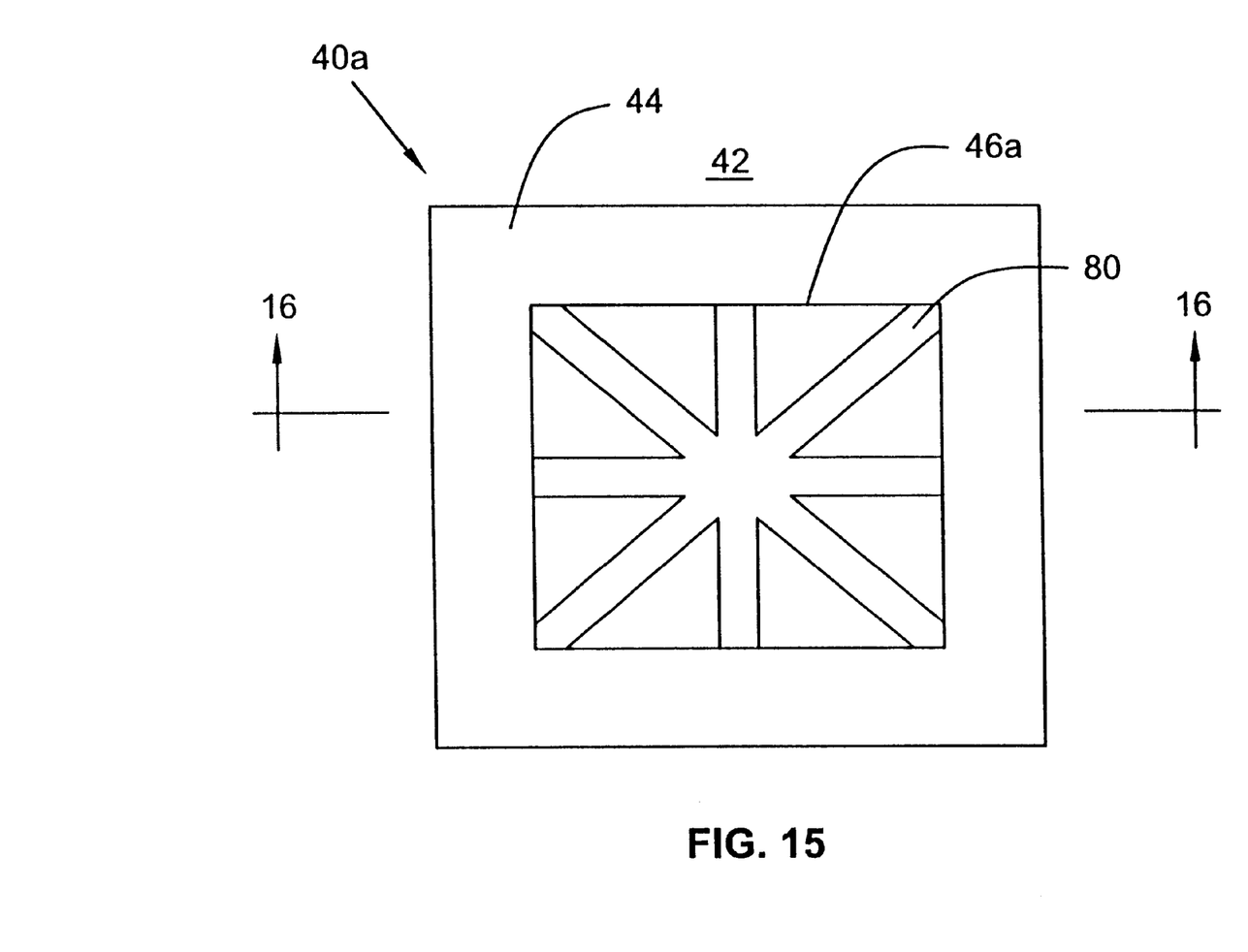
FIG. 15 is an enlarged top plan view of the substrate under an integrated inductor in accordance with one embodiment of the present invention.
Figure 15A:
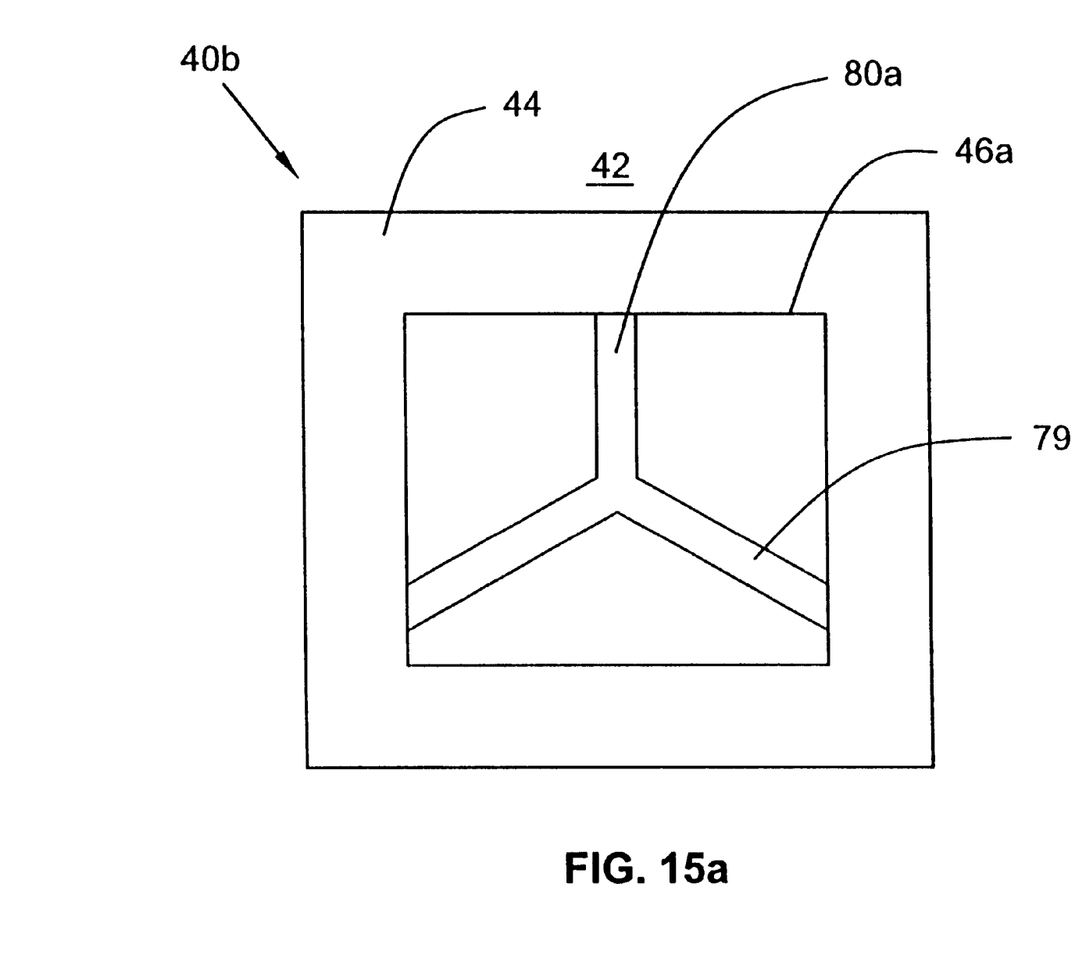
FIG. 15a is an enlarged top plan view of the substrate under an integrated inductor in accordance with one embodiment of the present invention.

Referring to FIG. 15, an integrated inductor 40a may include a P-type substrate 42 with a deep N-well 44 formed therein. A P-well 46a may be formed within the deep N-well 44. A trench 80 may be defined in the substrate 42 extending completely across the P-well 46a. In one embodiment of the present invention, the trench structure 80 is in a plurality of arms extending from the center for example in an X-shape. FIG. 15a shows another embodiment with three equally spaced arms 79 forming a trench 80a. Advantageously, the trench structure 80 radiates outwardly from the center of the P-well 46a in the form of three or more arms.

The trench structure 80 may be formed using conventional trench techniques widely utilized in connection with CMOS integrated circuit fabrication processes. The trench structure 80 may extend completely across the P-well 46a in two dimensions.

Figure 16:
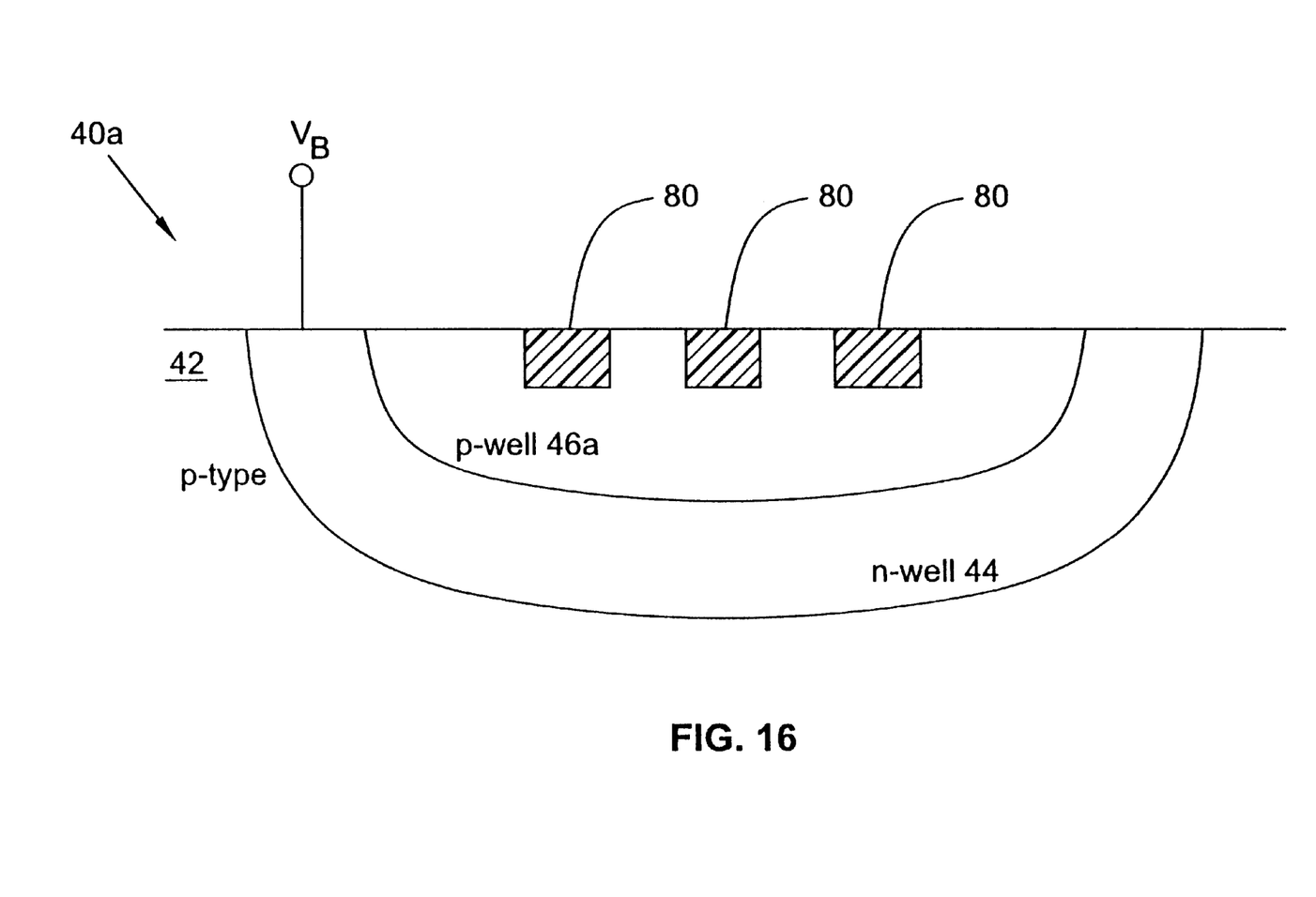
FIG. 16 is an enlarged cross-sectional view taken generally along the line 16—16 in FIG. 15.

Referring to FIG. 16, the trench structure 80 may extend into the P-well 46a to a depth of approximately 0.4 to 0.5 microns in one embodiment of the present invention. Advantageously, the trench structure 80 extends deep enough into the P-well 46a to disrupt and push the space (image) eddy currents (arising from magnetic coupling) deeper into the substrate. By providing a gridwork of trench structures 80, the loss from the image eddy currents may be effectively reduced in one embodiment of the invention.

The trench structure 80 is advantageously filled with an insulator, such as oxide, in one embodiment of the present invention. Forming trenches and filling the trenches with insulators are well understood by those skilled in the art of CMOS process design.

Figure 17:
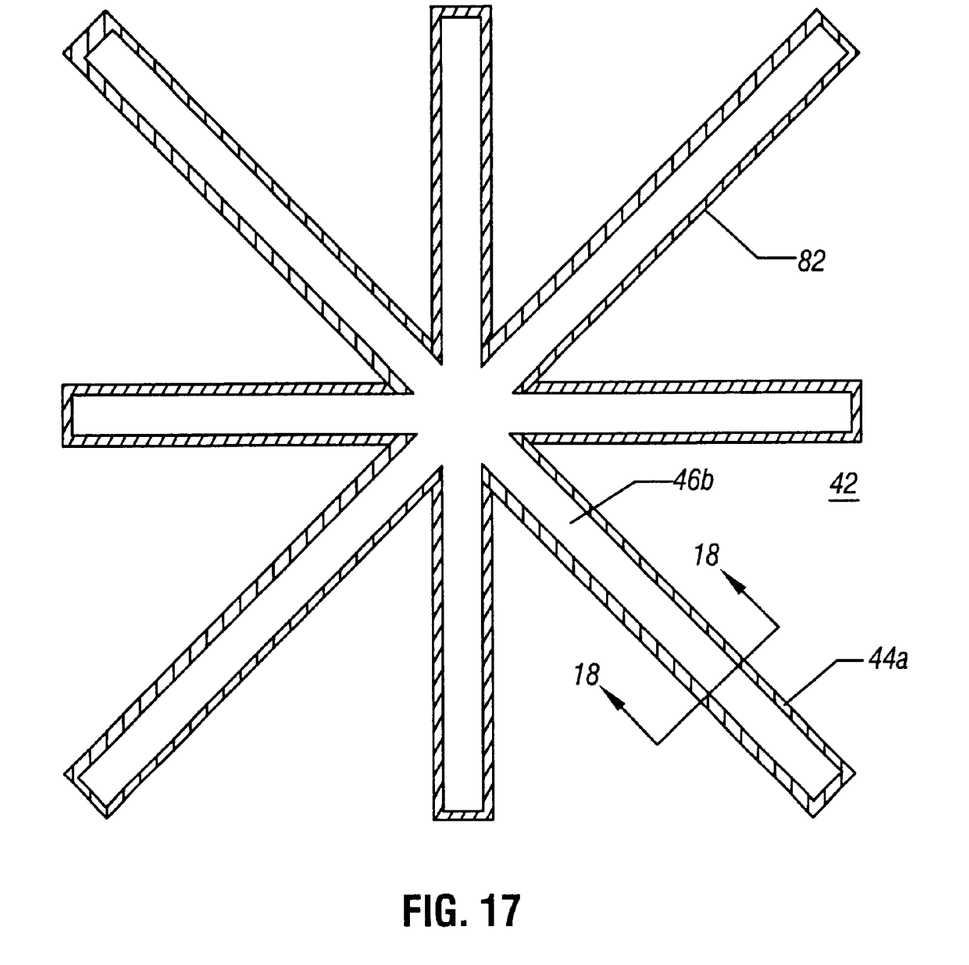
FIG. 17 is an enlarged top plan view of the substrate in accordance with another embodiment of the present invention.
Figure 18:
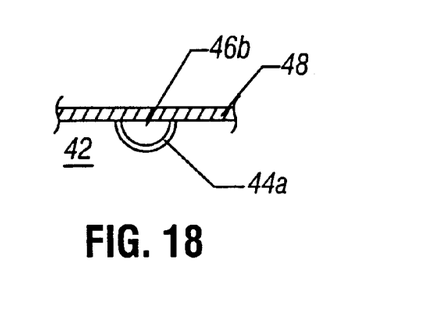
FIG. 18 is an enlarged cross-sectional view taken generally along the line 18—18 in FIG. 17.

Referring to FIG. 17, the configuration of a triple well including a P-well 46b and an N-well 44a within a substrate 42 may be arranged so as to reduce induced substrate eddy currents arising from overlying spiral inductors. For example, as shown in FIG. 18, an overlying spiral inductor 48 may be situated over the fingers 82 of a generally star-shaped triple well. Each of the fingers 82 may be radially extending from a central position. Each finger 82 may include a P-well 46b formed in an N-well 44a, in turn formed in the substrate 42.

The effect of the star-shaped triple well, as shown in FIGS. 17 and 18, is to reduce induced substrate eddy currents. The star-shape may be made of any number of fingers 82, from three radially extending fingers 82 on up.

In some embodiments, trenches (not shown) may be positioned between angularly displaced fingers 82 so as to further reduce the occurrence of induced substrate eddy currents. For example, while trenches may not extend through the central portion of the triple well shown in FIG. 17, each trench may be angularly displaced between two adjacent radially disposed fingers 82.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An integrated circuit comprising:
   a substrate of a first conductivity type;
   a spiral inductive element formed over said substrate; and
   a triple well includes a second conductivity type well with a first conductivity type well formed in the second conductivity type well formed in said substrate beneath said inductive element, said triple well including at least three radially extending fingers shaped triple wells.

2. The circuit of claim 1 wherein said circuit is a complementary metal oxide semiconductor circuit.

3. The circuit of claim 1 wherein said triple well is formed in a x-shape.

4. The circuit of claim 1 wherein said triple well includes a plurality of fingers which radiate outwardly from a center.

5. The circuit of claim 4 including at least six fingers.

6. The circuit of claim 1 wherein said triple well includes an N-well with a P-well formed in said N-well and wherein said substrate is a P-type substrate.

7. The circuit of claim 6 wherein said N-well is a deep N-well.

8. The circuit of claim 7 wherein said inductive element is formed over said P-well.

9. The circuit of claim 1 wherein said triple well forms a reverse biased diode between the substrate and said inductive element.

10. The current of claim 1 wherein said triple well is star-shaped.

* * * * *